United States Patent
Panosyan et al.

(10) Patent No.: US 10,283,962 B2
(45) Date of Patent: May 7, 2019

(54) SYSTEMS AND METHODS FOR REACTIVE POWER COMPENSATION

(71) Applicant: General Electric Company, Schenectady, NY (US)

(72) Inventors: Ara Panosyan, Bavaria (DE); Eva-Maria Baerthlein, Hamburg (DE)

(73) Assignee: General Electric Company, Schenectady, NY (US)

( * ) Notice: Subject to any disclaimer, the term of this patent is extended or adjusted under 35 U.S.C. 154(b) by 310 days.

(21) Appl. No.: 14/906,281

(22) PCT Filed: Jul. 25, 2013

(86) PCT No.: PCT/US2013/051918
§ 371 (c)(1),
(2) Date: Jan. 20, 2016

(87) PCT Pub. No.: WO2015/012828
PCT Pub. Date: Jan. 29, 2015

(65) Prior Publication Data
US 2016/0164294 A1 Jun. 9, 2016

(51) Int. Cl.
*H02J 1/10* (2006.01)
*H02J 3/38* (2006.01)
(Continued)

(52) U.S. Cl.
CPC .............. *H02J 3/18* (2013.01); *G01R 21/003* (2013.01); *H02J 3/16* (2013.01); *H02J 3/1842* (2013.01); *Y02E 40/22* (2013.01); *Y02E 40/34* (2013.01)

(58) Field of Classification Search
CPC ... H02J 3/18; H02J 3/16; H02J 3/1842; G01R 21/003; Y02E 40/34; Y02E 40/22
(Continued)

(56) References Cited

U.S. PATENT DOCUMENTS

| 5,336,991 A | 8/1994 | Atherton et al. |
| 5,657,237 A | 8/1997 | Mazzoni |
| 5,818,208 A | 10/1998 | Othman et al. |

(Continued)

FOREIGN PATENT DOCUMENTS

| CN | 102427235 A | 4/2012 |
| EP | 2582002 A2 | 4/2013 |

(Continued)

OTHER PUBLICATIONS

International Search Report and Written Opinion issued in connection with corresponding PCT application No. PCT/US2013/051918 dated Jun. 5, 2014.

(Continued)

*Primary Examiner* — Richard Tan
(74) *Attorney, Agent, or Firm* — Catherine J. Winter; GPO Global Patent Operation

(57) ABSTRACT

A method for compensating self-induced voltage variations includes computing a first reactive power value ($Q_1$), obtaining a voltage value at a point of interconnection (POI) between at least one power source and a power grid, comparing the voltage value with one or more pre-defined voltage limits, computing at least one compensation factor (CF) corresponding to at least one portion of the first reactive power value ($Q_1$) based on an output of the comparison between the voltage value and the one or more pre-defined voltage limits, computing a second reactive power value ($Q_2$) as a function of the at least one portion of the first reactive power value ($Q_1$) and the at least one CF, generating a reactive power compensation command based on the computed second reactive power value ($Q_2$), and transmitting the reactive power compensation command to a power converter.

16 Claims, 8 Drawing Sheets

(51) Int. Cl.
*H02J 7/34* (2006.01)
*H02J 3/18* (2006.01)
*H02J 3/16* (2006.01)
*G01R 21/00* (2006.01)

(58) Field of Classification Search
USPC .......................................................... 307/62
See application file for complete search history.

(56) References Cited

U.S. PATENT DOCUMENTS

| | | | |
|---|---|---|---|
| 6,549,440 B2 | 4/2003 | Tassitino, Jr. et al. | |
| 7,839,024 B2 | 11/2010 | Cardinal et al. | |
| 2009/0218817 A1* | 9/2009 | Cardinal | F03D 7/028 290/44 |
| 2012/0212191 A1 | 8/2012 | Yuzurihara et al. | |
| 2012/0217807 A1 | 8/2012 | Galler et al. | |
| 2012/0277919 A1* | 11/2012 | Ko | H02J 3/16 700/286 |

FOREIGN PATENT DOCUMENTS

| | | |
|---|---|---|
| JP | 2003061250 A | 2/2003 |
| JP | 2005160188 A | 6/2005 |
| JP | 2011257894 A | 12/2011 |
| JP | 2013008079 A | 1/2013 |
| WO | 2012016585 A1 | 2/2012 |

OTHER PUBLICATIONS

Katiraei et al., "Power Management Strategies for a Microgrid with Multiple Distributed Generation Units", IEEE Transactions on Power Systems, vol. No. 21, Issue No. 4, pp. 1821-1831, Nov. 2006.
Xu et al., "Influence analysis of Compensation Factor at the Valve Side on HVDC Transmission System Based on Filter Commutated Converter", Third International Conference on Electric Utility Deregulation and Restructuring and Power Technologies, pp. 1732-1736, Apr. 6-9, 2008.

* cited by examiner

SYSTEMS AND METHODS FOR REACTIVE POWER COMPENSATION

BACKGROUND

The invention relates to a system and a method for reactive power compensation in electrical power networks.

Electrical power networks are used for transmitting and distributing electricity for various purposes. These networks experience voltage variations during operation that are caused by the variation in generation of active and reactive power by different power generating devices and variable consumption of active and reactive power by different loads in the electrical power network.

Electrical power networks may have large and fast voltage variations (for example, due to increasing amount of intermittent renewable energy) that may result in excessive operation of voltage regulating devices such as on-load tap changing transformers, voltage regulators and capacitors. Excessive operation of mechanically-switched transformer taps and capacitors may lead to increased maintenance and diminished operating life of these devices.

One existing approach for mitigating the voltage variation is to provide a closed-loop voltage control. For example, in some renewable power generation systems, a closed-loop controller adjusts a power factor of a power converter to provide the reactive power needed for mitigating the voltage variation. The closed-loop controller, however, may undesirably interact with other reactive power sources and voltage regulating devices in the electrical power network during this process. Furthermore, the closed-loop controller may tend to compensate for the reactive power demand of the network and connected loads, which may result in increased losses in the source of reactive power and suboptimal utilization of its dynamic capabilities.

Another existing approach for mitigating voltage variations in the power network varies the reactive power according to Q-V characteristics (or Q-V curve), where a reactive power 'Q' is calculated as a function of a voltage 'V' measured at a point of interconnection (POI). However, in this approach, the controller may undesirably interact with other reactive power sources, as well as with other voltage regulating devices in the electrical power network. Also, in this approach, voltage variations caused by loads and other power generating devices may be compensated, which is undesirable.

In yet another approach, the reactive power may be varied according to Q-P characteristics (or Q-P curve), where the reactive power 'Q' is calculated as a function of an active power 'P' injected by a power generating source into the electrical power network. This approach compensates for only self-induced voltage variation, instead of compensating for the reactive power demand of the loads and other generating devices. This approach may however have an unwanted impact on the system since this approach may compensate for voltage rise when low voltage conditions exist, for example, during peak load conditions. The voltage rise caused by the power injection may be beneficial to improve the low voltage conditions. However, due to dependence on the injected active power 'P' alone, regardless of the state of the voltage at the POI for compensation, the controller may observe an increase in the active power 'P' and therefore may provide reactive power compensation even though it is not required. This approach may therefore lead to needless increased losses, both in the network and the power source, due to unnecessary compensation.

Hence, there is a need for an improved reactive compensation system and method to address the aforementioned issues.

BRIEF DESCRIPTION

In accordance with one embodiment, a method for compensating self-induced voltage variations is provided. The method includes computing a first reactive power value ($Q_1$); obtaining a voltage value at a point of interconnection (POI) between at least one power source and a power grid; and comparing the voltage value with one or more pre-defined voltage limits. The method further includes, for at least one portion of the first reactive power value ($Q_1$), computing at least one compensation factor (CF) corresponding to the at least one portion of the first reactive power value ($Q_1$) based on an output of the comparison between the voltage value and the one or more pre-defined voltage limits; computing a second reactive power value ($Q_2$) as a function of the at least one portion of the first reactive power value ($Q_1$) and the at least one CF; generating a reactive power compensation command based on the computed second reactive power value ($Q_2$); and transmitting the reactive power compensation command to a power converter.

In accordance with another embodiment, a system comprises a controller coupled to a power converter. The controller comprises a first computation unit for computing a first reactive power value ($Q_1$); a voltage determination unit for obtaining a voltage value at a point of interconnection (POI) between at least one power source and a power grid; a voltage comparator unit for comparing the voltage value with at least one pre-defined voltage limit. The controller further comprises, for at least one portion of the first reactive power value ($Q_1$), a compensation factor (CF) computation unit for computing at least one CF corresponding to the at least one portion of the first reactive power value ($Q_1$) based on an output of the comparison between the voltage value and the at least one pre-defined voltage limit; a second computation unit for computing a second reactive power value ($Q_2$) as a function of the at least one portion of the first reactive power value ($Q_1$) and the at least one CF; and a command generation unit for generating a reactive power compensation command based on the computed second reactive power value ($Q_2$). The controller further comprises an input/output (I/O) unit for transmitting the reactive power compensation command to the power converter.

DRAWINGS

These and other features and aspects of embodiments of the present invention will become better understood when the following detailed description is read with reference to the accompanying drawings in which like characters represent like parts throughout the drawings, wherein.

DETAILED DESCRIPTION

Unless defined otherwise, technical and scientific terms used herein have the same meaning as is commonly understood by one of ordinary skill in the art to which this disclosure belongs. The terms "first", "second", and the like, as used herein do not denote any order, quantity, or importance, but rather are used to distinguish one element from another. Also, the terms "a" and "an" do not denote a limitation of quantity, but rather denote the presence of at least one of the referenced items. The term "or" is meant to be inclusive and mean one, some, or all of the listed items. The use of terms such as "including," "comprising," or "having" and variations thereof herein are meant to encompass the items listed thereafter and equivalents thereof as well as additional items. Additionally, for purposes of explanation, specific numbers, components, and configurations are set forth in order to provide a thorough understanding of various embodiments of the invention.

Embodiments of the present invention are directed to system and method for providing selective reactive power compensation, which is based on one or more compensation factors (CFs) that are determined using a voltage value at a point of interconnection (POI) between a power source and a power grid. The system may include a controller coupled to the power source in an electrical power system. The controller may be implemented within a power converter or coupled to the power converter. The power source may induce a voltage change in the electrical power system during its operation, which may be compensated by the controller and power converter. The controller may compute a first reactive power value ($Q_1$) and may obtain a voltage value at the POI. The controller may further compare this voltage value with one or more pre-defined voltage limits. The controller may then compute one or more CFs based on an output of the comparison between the voltage value and the pre-defined voltage limits. The controller may further compute a second reactive power value ($Q_2$) as a function of one or more portions of the first reactive power value ($Q_1$) and the one or more CFs. The controller may subsequently generate a reactive power compensation command based on the computed second reactive power value ($Q_2$). The controller further transmits this reactive power compensation command to the power converter for use in compensating for the voltage variation induced by the power source electrically coupled to the power converter. Various embodiments of the invention described herein primarily relate to compensating for voltage variations being induced by the power source; however, the invention may be extended to cater to other voltage variations and applications without deviating from the scope of the invention.

Figure 1:
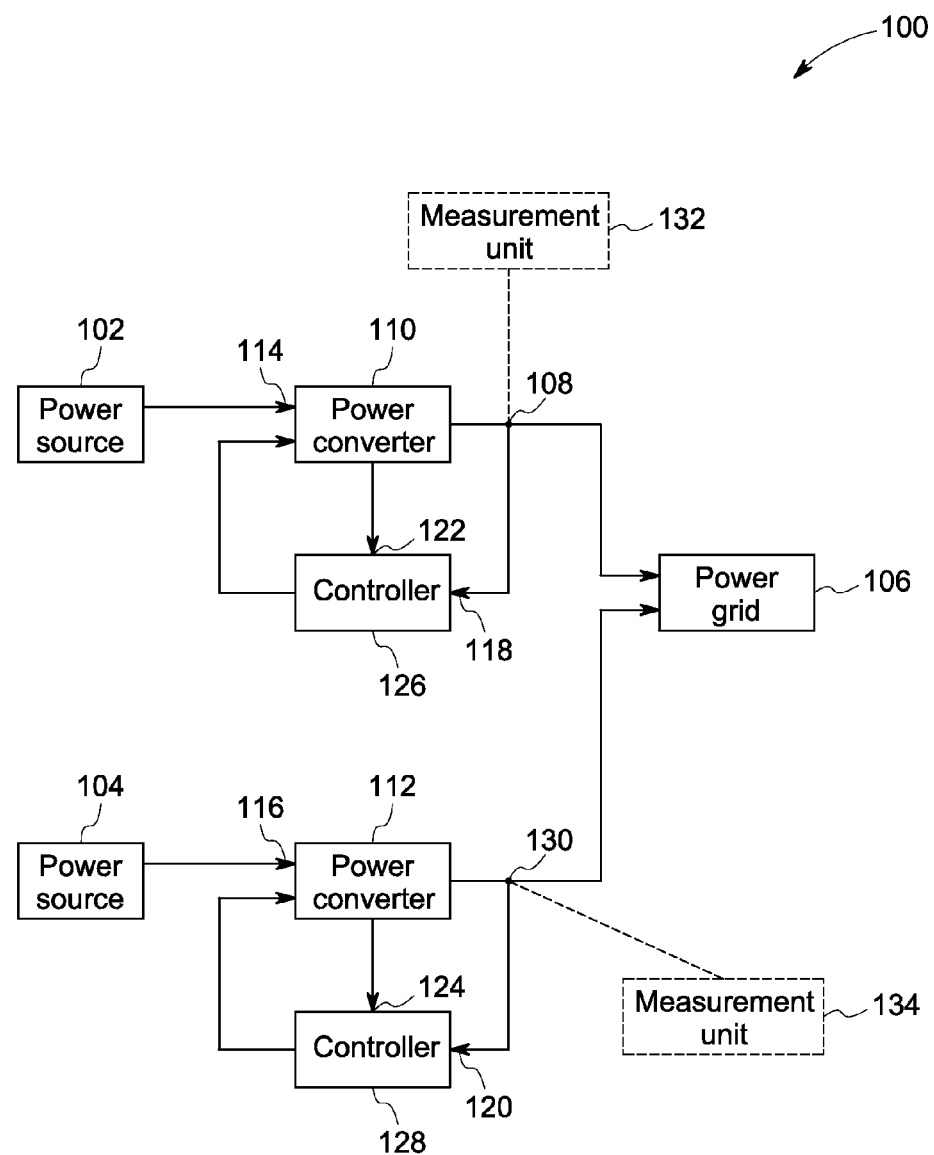
FIG. 1 is a block diagram representation of a prior art electrical power system including electrical power sources electrically coupled to respective power converters.

FIG. 1 is a block diagram representation of a prior art electrical power system 100 (hereinafter 'system 100') including electrical power sources 102 and 104 electrically coupled to respective power converters 110 and 112, each of which is further electrically coupled to transmit power to a power grid 106 at respective point of interconnections (POI) 108 and 130. For the purpose of illustration, only two power sources 102 and 104 and two respective power converters 110 and 112 are shown in the system 100; however, any number of such electrical elements can be used. The power sources 102 and 104 may be renewable energy sources such as, but not limited to, photovoltaic (PV) sources, wind farms, or hydrokinetic energy sources. As shown in FIG. 1, the power converters 110 and 112 may receive input power 114 and 116 from the power sources 102 and 104, respectively. Also, the system 100 may further include controllers 126 and 128 coupled to the power converters 110 and 112, respectively.

Signals 118, 120 representing voltages at the respective POIs 108 and 130 may be transmitted to the respective controllers 126 and 128. Similarly, signals 122, 124 representing active power outputs of the respective power converters 110 and 112 may be transmitted to the respective controllers 126 and 128. As shown in FIG. 1, the system 100 may optionally include measurement units 132 and 134 (either outside or within the respective power converters 110 and 112) that may be configured to measure signals representing voltages and/or active power outputs at the respective POIs 108 and 130. During operation of the system 100, the power sources 102 and 104 may induce a voltage variation (hereinafter referred to as 'self-induced voltage variation') in the system 100. The controllers 126 and 128 may be configured to control the respective power converters 110 and 112 to compensate for the induced voltage variation. In one conventional embodiment, upon receiving the signals 118, 120 representing voltages at the respective POIs 108 and 130 and signals 122, 124 representing active power outputs, the controllers 126 and 128 may compute a value of reactive power using a known technique. For example, a state observer method may be used to compute a reactive power value. In this method, the signals 118, 120 representing voltages at the respective POIs 108 and 130 and the signals 122, 124 representing active power outputs are used by a state observer (not shown) within each of the respective controllers 126 and 128 to determine sensitivity coefficients. The sensitivity coefficients are used as the parameters to calculate the value of reactive power output, which is needed to compensate for the induced voltage variation. Each of the controllers 126 and 128 may further generate a reactive power command based on the value of the reactive power output, and may transmit this command to the respective power converters 110 and 112 for generating the calculated value of reactive power for compensating the induced voltage variation.

The above-mentioned operation of computation of reactive power output, and generation and transmission of a reactive power command is repeated continuously during the operation of the system 100.

Another known technique (not shown) for compensating the induced voltage variations uses a controller that determines power factor characteristics for a power converter based on information regarding a plurality of network parameters representing a variety of conditions to arrive at a curve representative of power factor along with information on an active power output from a power converter to obtain a reactive power output value of the power converter. The controller in this technique may then generate a reactive power command and may transmit this command to the power converter to compensate for the induced voltage variations.

Figures 2, 3:
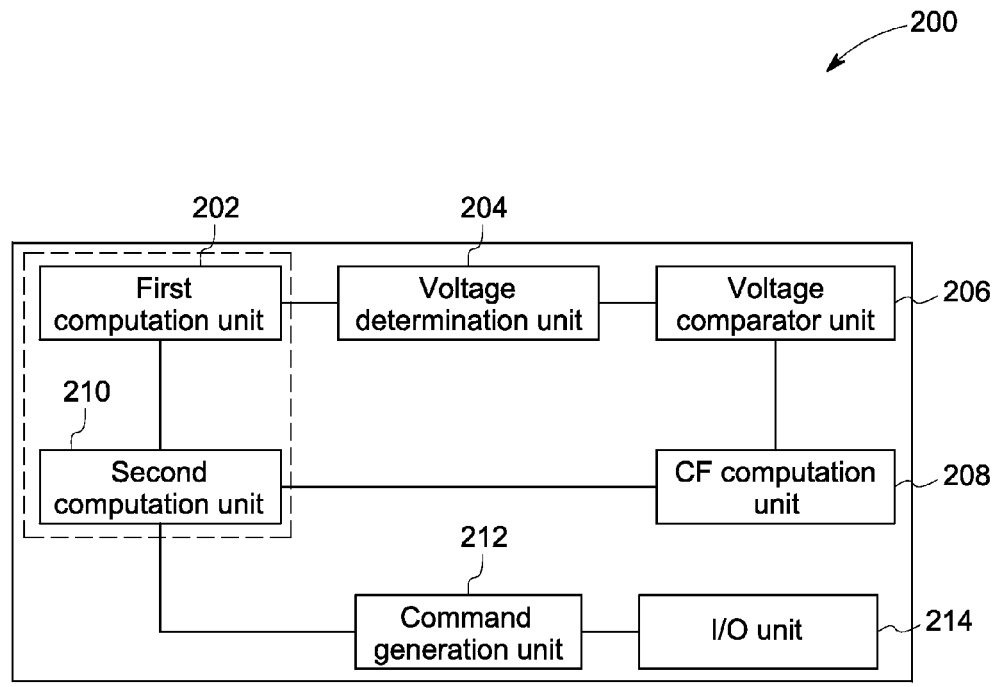
FIG. 2 is a controller that may be used for compensating self-induced voltage variations, in accordance with one embodiment.
FIG. 3 represents a map between an obtained voltage value and its corresponding CF value, in accordance with one embodiment.

Various embodiments of the present invention provide a new technique of computing a reactive power value of a power converter in an electrical power system (such as the prior art system 100) and use this value for compensating the self-induced voltage variations. FIG. 2 is a controller 200 that may be used for compensating self-induced voltage variations, in accordance with one embodiment. For the purpose of the description, various components in the prior art system 100 will be referred to for describing the electrical power system in which the controller 200 is being implemented. The controller 200 may be configured to control the respective power converters 110 and 112 to compensate for the self-induced voltage variations. For ease of reference, the control of the power converter 110 will be described herein; however, the power converter 112 may be similarly controlled with a respective controller. In some embodiments, as shown in FIG. 2, the controller 200 may include a first computation unit 202 that may be configured to compute the reactive power value '$Q_1$', which is hereinafter referred to as first reactive power value ($Q_1$). In one exemplary embodiment, the controller 200 may use Q-P characteristics (for example, using a constant power factor) to determine the first reactive power value ($Q_1$). In another exemplary embodiment, Q-V characteristics may be used to determine the first reactive power value ($Q_1$). In yet another exemplary embodiment, the first reactive power value ($Q_1$) may be determined using prior knowledge or experience of the utility operator.

In some embodiments, the controller 200 may further include a voltage determination unit 204 that may be configured to obtain a voltage value 'V' at the POI 108 between the power source 110 and the power grid 106. In some embodiments, the voltage determination unit 204 may obtain this voltage value from the measurement unit 132. Alternatively, in some other embodiments, the voltage determination unit 204 may be same as the measurement unit 132. As shown in FIG. 2, the controller 200 may also include a voltage comparator unit 206 that may be configured to compare the obtained voltage value 'V' with one or more voltage limits. In some embodiments, the voltage limit for comparison with the obtained voltage value may be defined by a utility operator and hence this limit is hereinafter referred to as 'pre-defined voltage limit.' In one embodiment, the pre-defined voltage limits may include two voltage limits, for example, an upper limit and a lower limit such that the controller 200 may be configured to compensate differently for a voltage value closer to the lower limit than for a voltage value closer to the upper limit. In one exemplary embodiment, the upper limit may be defined as 1.2 per unit (pu), and the lower limit may be defined as 0.8 pu. In an alternate exemplary embodiment, the upper limit may have a value within a range of 1 to 1.2 pu, and the lower limit may have a value within a range of 0.8 to 1 pu.

In yet another embodiment, the pre-defined voltage limits may include a plurality of voltage values resulting in a plurality of voltage ranges such that the controller 200 may be configured to compensate differently for each of these voltage ranges. For example, the controller 200 may compensate for a voltage value in the range of 0.8 pu and 0.9 pu differently as compared to compensating for a voltage value in the range of 0.9 pu and 1 pu.

The amount of reactive power output of the power converter 112 may be limited by one or more CFs, in accordance with various embodiments. The controller 200 may include a CF computation unit 208 that may be configured to receive an output of the comparison between the obtained voltage value 'V' and the one or more pre-defined voltage limits from the voltage comparator unit 206, and further may be configured to compute one or more CFs based on this output. In one embodiment wherein upper and lower limits are used, the reactive power output of the power converter 112 may be damped by decreasing the CF value when the voltage value 'V' is closer to the lower limit, whereas the reactive power output may be amplified or not damped by either increasing the CF value or maintaining CF at 1 or a value close to 1 when the voltage value 'V' is closer to the upper limit. In other words, different CFs may be defined or computed for different voltage values based on the pre-defined voltage limits.

CFs may be computed using various techniques. One such technique is shown in FIG. 3 that represents a map 300 between the obtained voltage value 'V' and corresponding CF value, in accordance with one embodiment. As shown in FIG. 3, in one embodiment, when the obtained voltage value 'V' is less than or equal to a pre-defined lower limit '$V_{min}$' the CF computation unit 208 may define the CF to be a minimum value ($CF_{min}$). For example, for voltage value 'V' less than or equal to $V_{min}$, the CF may be defined by the utility operator as 0 or a value close to 0. In another embodiment, when the obtained voltage value 'V' is greater than or equal to a pre-defined upper limit '$V_{max}$' the CF computation unit 208 may define the CF to be a maximum value ($CF_{max}$). For example, for voltage value 'V' greater than or equal to $V_{max}$, the CF may be defined by the utility operator as 1 or a value close to 1. Since the CF approaches $CF_{max}$ when the voltage value 'V' is closer to the upper limit and the CF approaches $CF_{min}$ when the voltage value 'V' is closer to the lower limit, the CF in the latter case may be less than or equal to the CF in the former case. In an alternate embodiment, the utility operator may define a single CF for each voltage range. For example, CF may be 0 when the voltage value is less than 0.9 pu, or any value between 0.1 and 0.9 (as defined by the utility operator) when the voltage value is anywhere between 0.9 and 1 pu, or 1 when the voltage value is greater than 1.

In yet another embodiment, when the obtained voltage value 'V' is between '$V_{min}$' and '$V_{max}$,' the CF computation unit 208 may define the CF as a function of the obtained voltage value 'V.' In one exemplary embodiment, the CF computation unit 208 may compute CF using the below equation.

$$CF_t = \frac{|V_{t-1} - V_{min}|}{V_{max} - V_{min}} \qquad \text{eq-1}$$

where,
$CF_t$ is a compensation factor value computed at a time instance 't' ('first time instance'), and
$V_{t-1}$ is a voltage value obtained at a time instance 't-1,' which is previous to the time instance 't'

The voltage at the POI ('V') may undergo large fluctuations over a time period, in accordance with some embodiments. In such embodiments, in order to smoothen these voltage fluctuations, the CF computation unit 208 may average multiple CFs obtained over respective time instances to ensure a damping effect on the voltage value 'V.' In one such embodiment, a damped CF may be computed as a function of '$CF_t$' and a CF computed at a previous time instance 't-1' ($CF_{t-1}$ or 'second time instance'). In one such embodiment, the '$CF_{t-1}$' and '$CF_t$' may be averaged to compute a damped 'CF' to smoothen the voltage fluctuations.

$$CF = \frac{|CF_t + CF_{t-1}|}{2} \quad \text{eq-2}$$

where, the '$CF_{t-1}$' may be computed similar to $CF_t$ based on a voltage value '$V_{t-2}$' obtained at a time instance 't-2,' which is previous to the time instance 't-1.'

$$CF_{t-1} = \frac{|V_{t-2} - V_{min}|}{V_{max} - V_{min}} \quad \text{eq-3}$$

Although equation 2 considers only one '$CF_{t-1}$' computed at a previous time instance, any number ("N number") of previously computed CFs may be averaged to obtain the damped 'CF.' For example, '$CF_{t-2}$' and '$CF_{t-3}$' may be computed similar to '$CF_{t-1}$,' and $CF_{t-1}$, $CF_{t-2}$ and $CF_{t-3}$ may be averaged to compute a damped CF.

In some embodiments, CF may vary based on a utility operator's requirement, geography in which the controller 200 is implemented, or any combination thereof, instead of or in addition to the voltage value at the POI. In one example, the utility operator may define a certain value of CF corresponding to each voltage range. In another example, CF may be different in the USA as compared to that in Europe. This difference may be due to different values of voltage limits that may be defined by the utility operator in different countries.

As shown in FIG. 2, the controller 200 may further include a second computation unit 210 that may be configured to compute a second reactive power value ($Q_2$) as a function of one or more portions of the computed first reactive power value ($Q_1$) and the CF corresponding to these portions. As will be described later, the second reactive power value ($Q_2$) may be computed for either the complete first reactive power value ($Q_1$) signal, or only a high frequency or low frequency portion ('one or more portions') of the first reactive power value ($Q_1$) signal, or a combination of these high and low frequency portions of the first reactive power value ($Q_1$). In one embodiment, the second computation unit 210 may compute the second reactive power value ($Q_2$) using below equation.

$$Q_2 = CF^*Q_1 \quad \text{eq-4}$$

In various embodiments, as shown in FIG. 2, the controller 200 may further include a command generation unit 212 that may be configured to generate a reactive power compensation command based on the computed second reactive power value ($Q_2$). In one embodiment, the reactive power compensation command may include a command to generate the required value of reactive power or reactive current or adjust a power factor of the power converter 110 during operation. The controller 200 may further include an input/output (I/O) unit 214 that may be configured to transmit the reactive power compensation command to the power converter 110 for compensating the self-induced voltage variation.

The above-mentioned operation of computation of the second reactive power value ($Q_2$) and generation and transmission of the reactive power compensation command may be repeated continuously during the operation of the electrical power system.

In some embodiments, the controller 200 may be configured to compute one or more CFs and the second reactive power value ($Q_2$) either using the complete first reactive power value ($Q_1$) signal (for example, as shown in equation 4), or using a portion (high frequency or low frequency) of the first reactive power value ($Q_1$), or a combination of these high and low frequency portions of the first reactive power value ($Q_1$).

Figure 4:
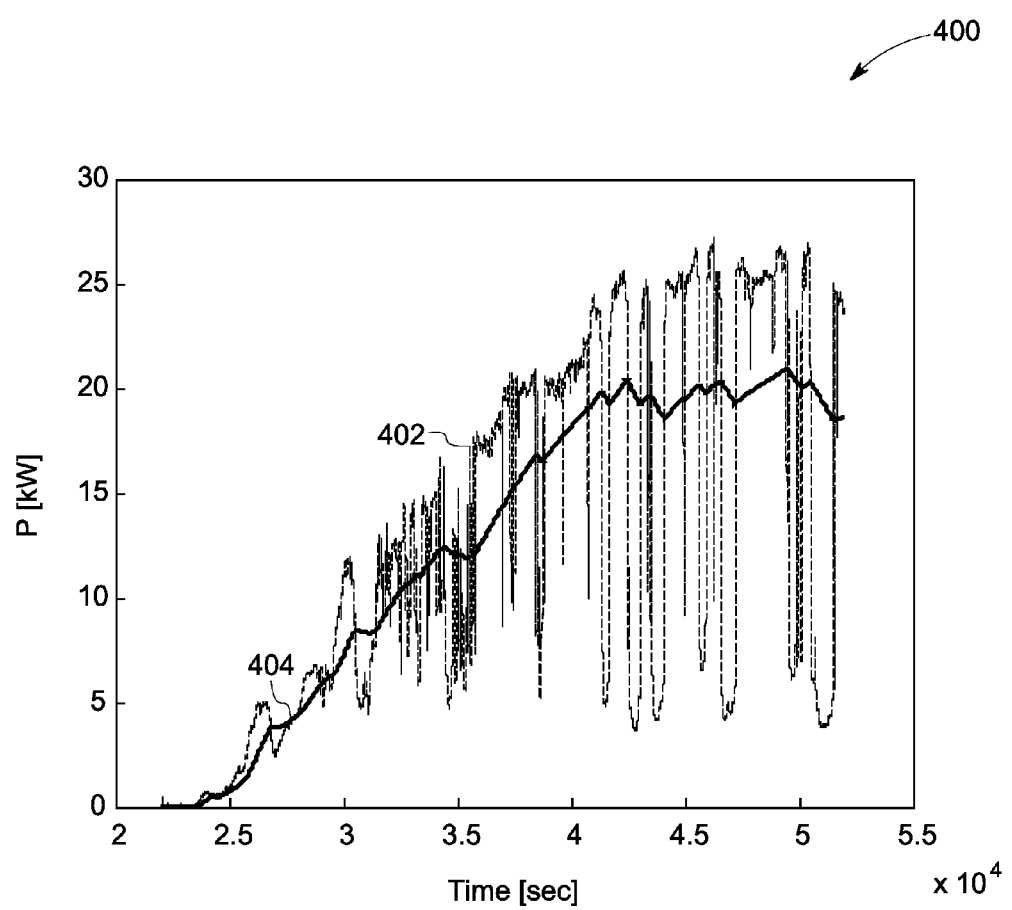
FIG. 4 is a graphical representation of a number of simulations conducted for reactive power compensation in the electrical power system with one curve for complete active power 'P' signal over a time period and another curve for a low frequency portion of 'P' over the same time period, in accordance with one embodiment.

FIG. 4 is a graphical representation 400 of a number of simulations conducted for reactive power compensation in an electrical power system with a curve 402 for complete active power 'P' signal over a time period and a curve 404 for a low frequency portion of P over the same time period, in accordance with one embodiment. In some embodiments, the injected active power 'P' may be divided into a low frequency portion and a high frequency portion. In one embodiment, a low pass or a high pass filter may be integrated with the first computation unit 202 to separate the high frequency portion from the low frequency portion. As shown in FIG. 4, the low frequency portion of P is indicated by the curve 404, whereas the high frequency portion (not shown) may be the difference between the complete active power 'P' (indicated by the curve 402) and the low frequency portion or may be computed differently such that the high frequency portion is at a higher frequency than the low frequency portion, for example, depending upon threshold frequencies of the filter.

In one embodiment, the first computation unit 202 may be configured to filter a low frequency portion of P from the complete P signal and then use this low frequency portion of P to compute a low frequency portion of the first reactive power value ($Q_1$), hereinafter referred to as $Q_{LF}$. $Q_{LF}$ may be multiplied with a CF for a low frequency portion ($CF_{LF}$) to compute one reactive power value. In one exemplary embodiment, the $CF_{LF}$ may be computed as described above. Additionally or alternatively, in such an embodiment, the first computation unit 202 may be configured to filter a high frequency portion of the complete P signal and then use this high frequency portion of P to compute a high frequency portion of the first reactive power value ($Q_1$), hereinafter referred to as $Q_{HF}$. In such an embodiment, this $Q_{HF}$ may be multiplied with a CF for a high frequency portion ($CF_{HF}$) to compute another reactive power value. In still another embodiment wherein a combination of the low and high frequency portions are used to obtain the second reactive power value ($Q_2$), the second reactive power value ($Q_2$) may be computed as a sum of these two reactive power values as given below in equation 5.

$$Q_2(Q_{LF} \times CF_{LF}) + (Q_{HF} \times CF_{HF}) \quad \text{eq-5}$$

In one exemplary embodiment, the $CF_{HF}$ may be same as the $CF_{max}$. In one exemplary embodiment, the $CF_{LF}$ may be same as the $CF_{min}$. If instead the $CF_{HF}$ is same as the $CF_{LF}$ (referred to as 'CF'), then equation 5 may be written as a product of '$Q_{LF} + Q_{HF}$' and CF.

In an alternate embodiment, the first computation unit 202 may compute the complete first reactive power value ($Q_1$) from the complete active power 'P.' In such an embodiment, the first computation unit 202 may be configured to further filter $Q_{LF}$ from the complete first reactive power value ($Q_1$). Similar to above, $Q_{LF}$ may be multiplied with the $CF_{LF}$ to compute one reactive power value. Additionally or alternatively, in such an embodiment, the first computation unit 202 may be configured to filter $Q_{HF}$ from the computed first reactive power value ($Q_1$). Also, this $Q_{HF}$ may be multiplied with $CF_{HF}$ to compute another reactive power value for $Q_{HF}$. The second reactive power value ($Q_2$) may be computed using equation 5.

Figure 5:
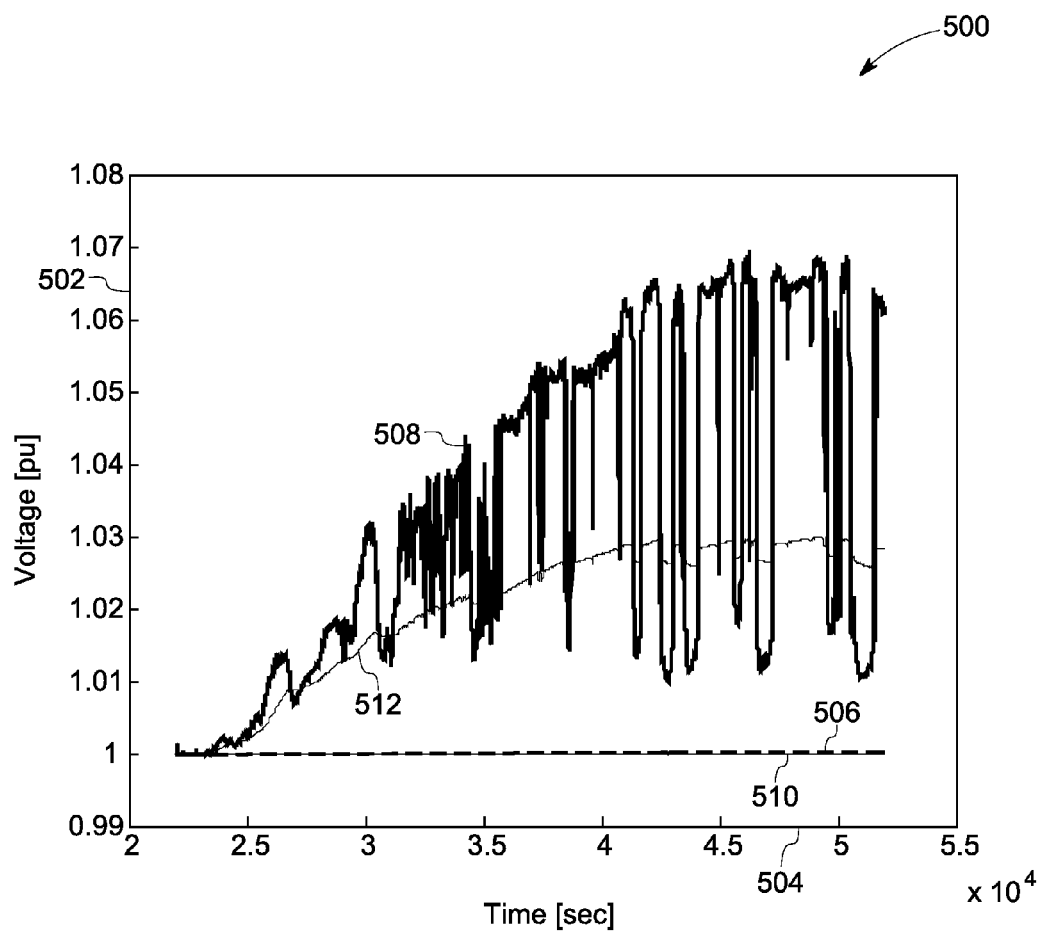
FIG. 5 is a graphical representation of a number of simulations conducted for comparing voltage curves for different conditions over a time period, in accordance with one embodiment.

FIG. 5 is a graphical representation 500 of a number of simulations conducted for comparing voltage curves for different conditions over a time period, in accordance with one embodiment. Y-axis 502 represents voltage value at the POI in pu, and X-axis 504 represents time in seconds.

A first simulation is conducted without any active power or PV injection. The voltage at the POI is shown by a curve 506. As shown in FIG. 5, as no network loads are regarded, the voltage at the POI is constant at 1 pu without any voltage variations.

A second simulation is conducted with PV injection at unity power factor, that is, without any reactive power being output by the power converter 110. The voltage at the POI is shown by a curve 508. The voltage variations between 1 and 1.07 pu may be due to the variation of active power 'P.'

A third simulation is conducted with PV injection and full reactive power compensation (that is, when CF is $CF_{max}$). The term 'full reactive power compensation' as used herein signifies that the self-induced voltage variation has been fully or perfectly compensated. The voltage at the POI is shown by a curve 510. The curve 510 overlaps with the curve 506 and hence is hardly visible in FIG. 5. In other words, the power converter 110 perfectly compensates the voltage variations at the POI and thus maintains the voltage constantly at 1 pu.

A fourth simulation is conducted with PV injection and a selective reactive power compensation, which is based on CF. The voltage at the POI is shown by a curve 512. The voltage variations are due to the variation of active power 'P' and the second reactive power value ($Q_2$). As shown in FIG. 5, the voltage variations shown by the curve 512 are smaller (maintained between 1 and 1.03 pu) than the voltage variations in case no reactive power compensation is being provided (which is shown by curve 508). Although FIG. 5 shows that the voltage variations by the curve 512 is maintained between 1 and 1.03 pu; the voltage variations may be further lowered, for example, maintained below 1.03 pu, by variation of parameters like pre-defined voltage limits or using other alternate embodiments as described above.

Figure 6:
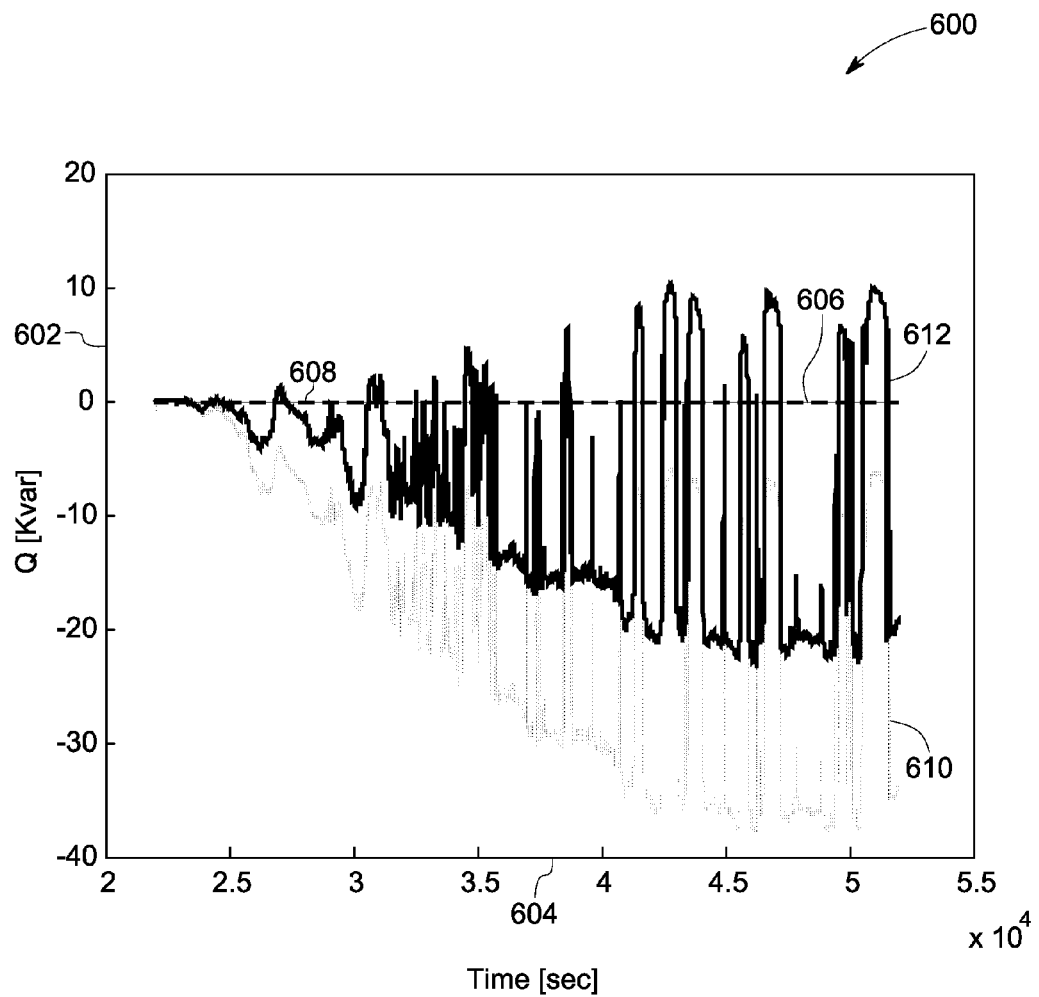
FIG. 6 is a graphical representation of a number of simulations conducted for comparing required reactive power for different conditions over a time period, in accordance with one embodiment.

FIG. 6 is a graphical representation 600 of a number of simulations conducted for comparing required reactive power for different conditions over a time period, in accordance with one embodiment. Y-axis 602 represents required reactive power '$Q_2$' in kilo volt amperes reactive (Kvar), and X-axis 604 represents time in seconds. The graphical representation 600 represents the required reactive power for different conditions over a time period.

A first simulation is conducted without any PV injection. The required reactive power is shown by a curve 606. As shown in FIG. 6, since no PV is being injected, no reactive power is required to be injected by the power converter 110.

A second simulation is conducted with PV injection at unity power factor, that is, without any reactive power being output by the power converter 110. The required reactive power is shown by a curve 608. The curve 608 overlaps with the curve 606 and hence the curve 606 is hardly visible in FIG. 6.

A third simulation is conducted with PV injection and full reactive power compensation (that is, when CF is $CF_{max}$). The required reactive power is shown by a curve 610. In order to fully compensate for the voltage variations, the power converter 110 needs to inject a large amount of reactive power, which results in high system losses.

A fourth simulation is conducted with PV injection and a selective reactive power compensation, which is based on CF. The required reactive power is shown by a curve 612. As shown in FIG. 6, the reactive power required in the fourth simulation (shown by the curve 612) is lesser (almost half) than the reactive power required in case of full reactive power compensation (shown by the curve 610).

Figure 7:
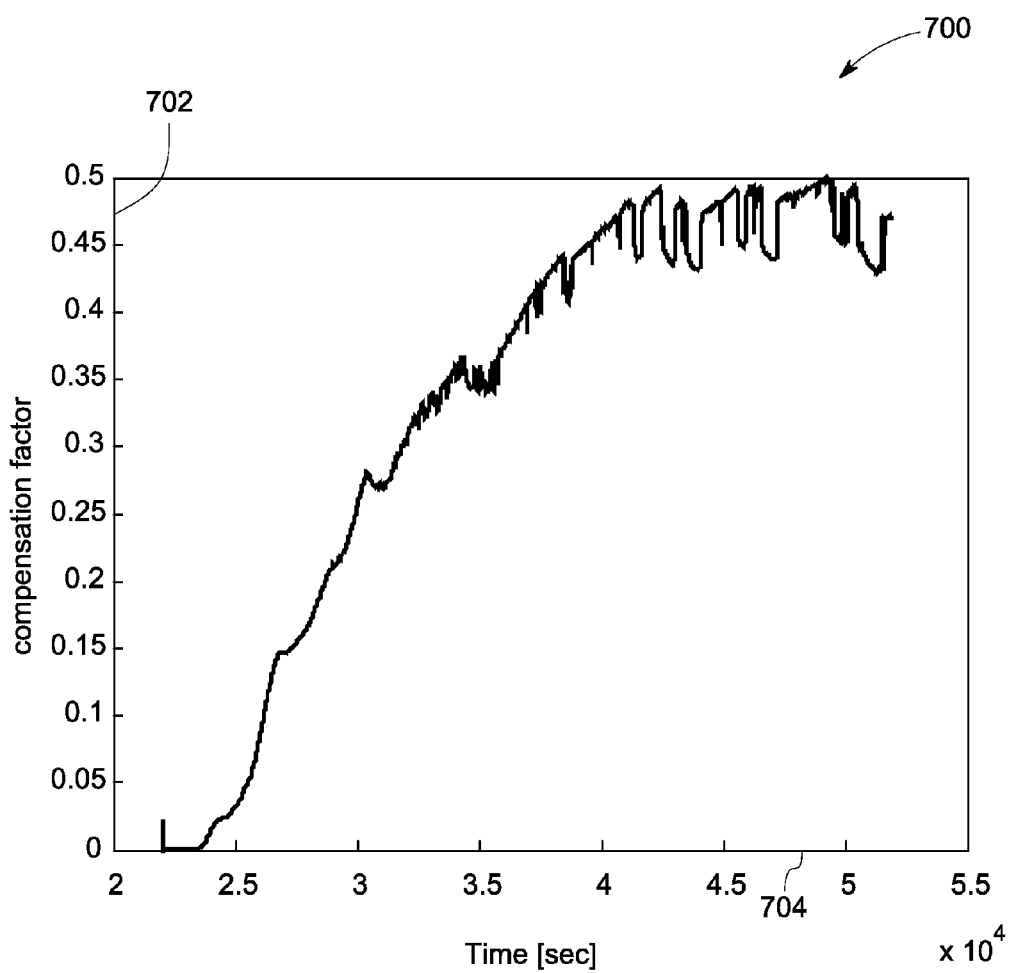
FIG. 7 is a graphical representation of a distribution of CF over a time period, in accordance with one embodiment.

FIG. 7 is a graphical representation 700 of a distribution of CF over a time period, in accordance with one embodiment. Y-axis 702 represents CF and X-axis 704 represents time in seconds. The graphical representation 700 represents different values of CF obtained at different time instances. In some embodiments, the CF may vary based on the voltage value at the POI, utility operator's requirement, geography in which the controller 200 is implemented, or any combination thereof.

Figure 8:
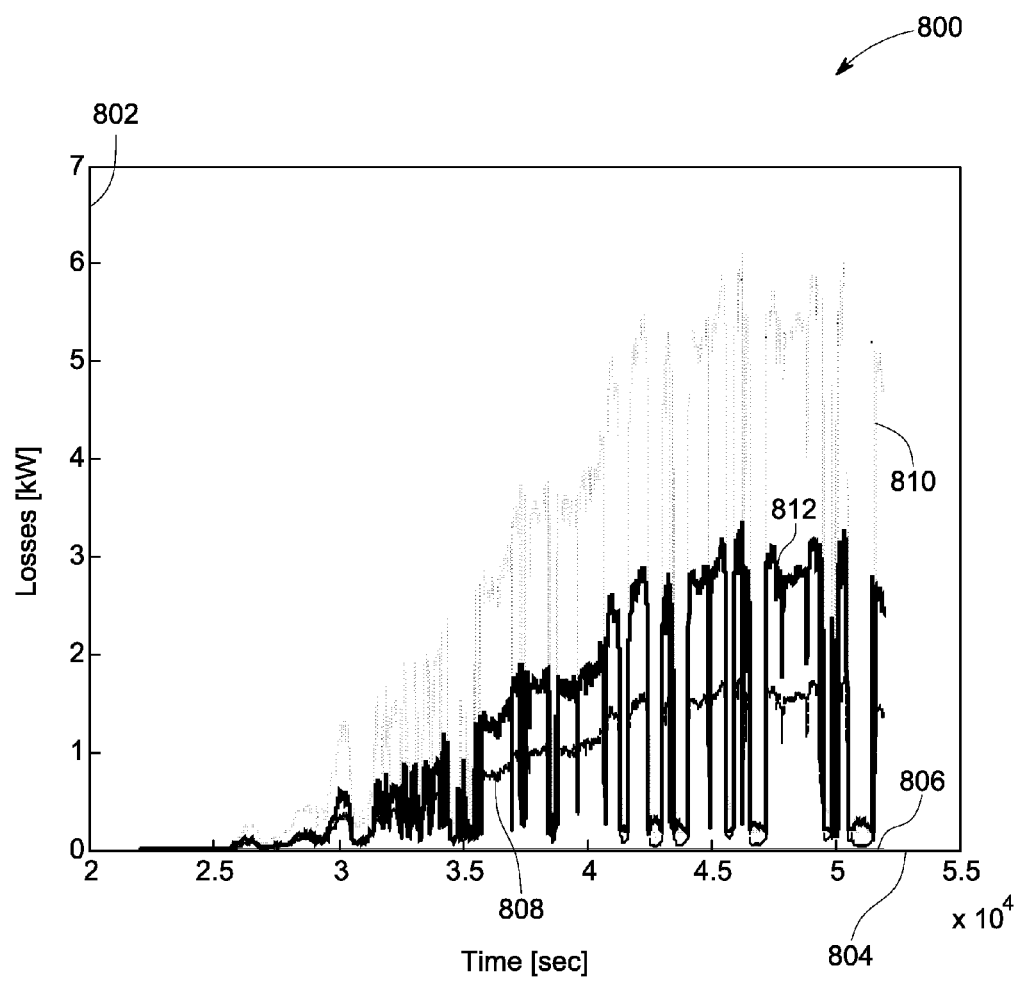
FIG. 8 is a graphical representation of a number of simulations conducted for comparing system losses under different conditions over a time period, in accordance with one embodiment.

FIG. 8 is a graphical representation 800 of a number of simulations conducted for comparing system losses under different conditions over a time period, in accordance with one embodiment. Y-axis 802 represents resulting system losses in kilo Watt (kW), and X-axis 804 represents time in seconds.

A first simulation is conducted without any PV injection. The system losses are shown by a curve 806. As shown in FIG. 8, since no PV is being injected, no reactive power is required to be injected by the power converter 110 and therefore system losses are nil.

A second simulation is conducted with PV injection at unity power factor, that is, without any reactive power being output by the power converter 110. The system losses are shown by a curve 808. Even though no reactive power is being fed into the system; however, due to active power, some system losses will exist as shown by the curve 808 in FIG. 8.

A third simulation is conducted with PV injection and full reactive power compensation (that is, when CF is $CF_{max}$). The system losses are shown by a curve 810. In order to fully compensate for the voltage variations, the power converter 110 in this case injects a large amount of reactive power and hence results in high amount of system losses.

A fourth simulation is conducted with PV injection and a selective reactive power compensation, which is based on CF. The system losses are shown by a curve 812. As shown in FIG. 8, the system losses in the fourth simulation (shown by the curve 812) are reduced in comparison to losses caused during full reactive power compensation. The losses in the fourth simulation are reduced by compensating only when required (for example, when the voltage value is greater than $V_{min}$) and by reducing the reactive power compensation using CF when the voltage value is within the pre-defined voltage limits.

Figure 9:
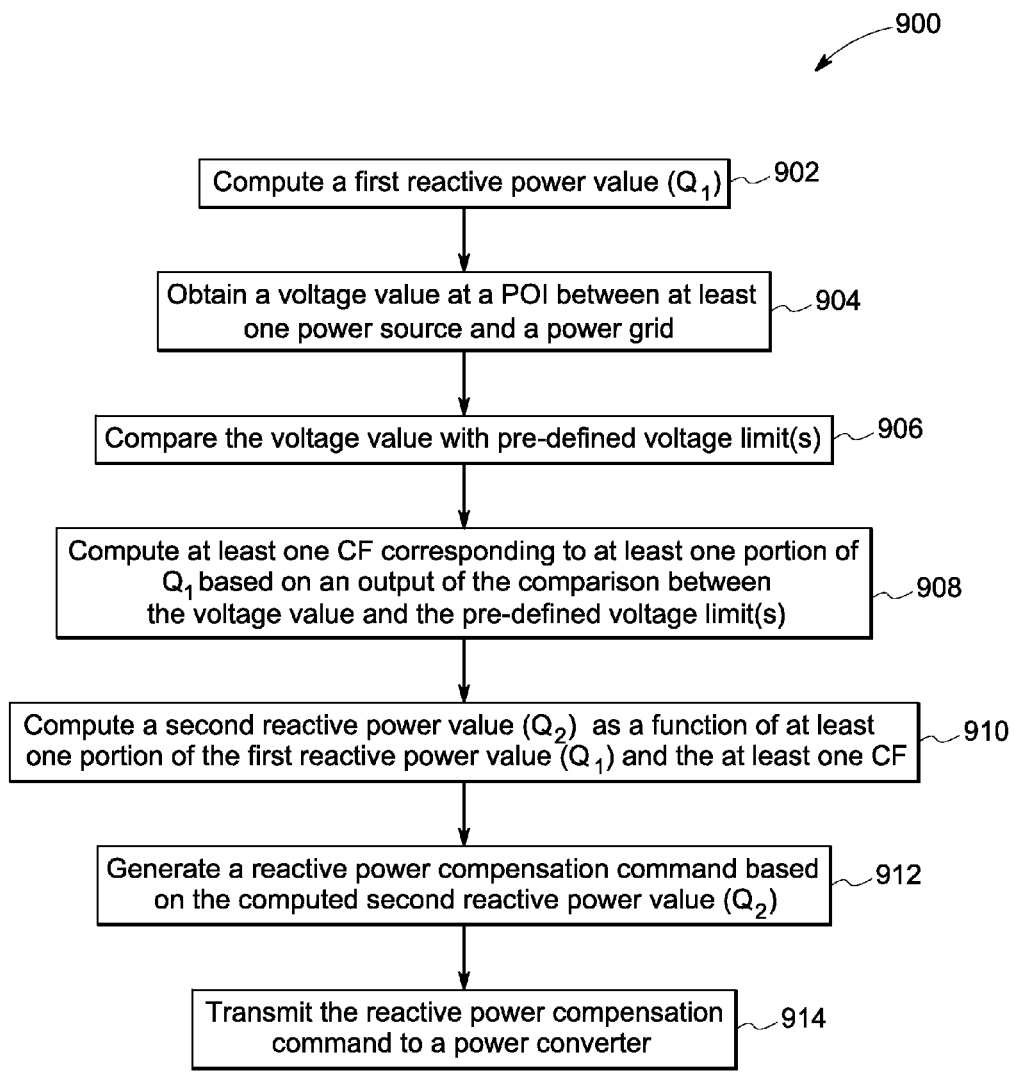
FIG. 9 is a flowchart depicting a method for providing selective reactive power compensation, in accordance with one embodiment.

In one embodiment, a method for compensating self-induced voltage variation is provided. FIG. 9 is a flowchart depicting a method 900 for providing selective reactive power compensation, in accordance with one embodiment. At step 902, a first reactive power value ($Q_1$) may be computed. In one exemplary embodiment, a controller (such as 200) may use Q-P characteristics to determine the first reactive power value ($Q_1$). In another exemplary embodiment, Q-V characteristics may be used to determine the first reactive power value ($Q_1$). In yet another exemplary embodiment, the first reactive power value ($Q_1$) may be determined using prior knowledge or experience of the utility operator.

At step 904, a voltage value 'V' at a POI (such as 108) between a power source (such as 110) and a power grid (such as 106) may be obtained. In some embodiments, a voltage determination unit (such as 204) may obtain this voltage value from a measurement unit (such as 132). In some other embodiments, the voltage determination unit may be same as the measurement unit.

Further, at step 906, the obtained voltage value 'V' may be compared with one or more pre-defined voltage limits. In some embodiments, the pre-defined voltage limit may be defined by a utility operator for comparison with the obtained voltage value. In one embodiment, the pre-defined voltage limits may include two limits, for example, an upper limit and a lower limit such that the compensation is performed differently for a voltage value closer to the lower limit as compared to a voltage value closer to the upper limit. In one exemplary embodiment, the upper limit may be defined as 1 pu, and the lower limit may be defined as 0.8 pu. In an alternate exemplary embodiment, the upper limit may have a value within a range of 1 to 1.2 pu, and the lower limit may have a value within a range of 0.8 to 1 pu. In an alternate embodiment, the pre-defined voltage limits may include a plurality of voltage values resulting in a plurality of voltage ranges such that the compensation may be performed differently for each of these voltage ranges. For example, the controller may compensate for a voltage value in the range of 0.8 pu and 0.9 pu differently as compared to compensating for a voltage value in the range of 0.9 pu and 1 pu.

At step 908, one or more CFs corresponding to one or more portions of the computed first reactive power value ($Q_1$) may be computed based on an output of the comparison between the obtained voltage value 'V' and the one or more pre-defined voltage limits. Various embodiments described above for computing such CFs may be equally applied to the method 900.

At step 910, a second reactive power value ($Q_2$) may be computed as a function of one or more portions of the computed first reactive power value ($Q_1$) and corresponding CFs. In some embodiments, the second reactive power value ($Q_2$) may be computed for either the complete first reactive power value ($Q_1$) signal or for only a high frequency or low frequency portion of the first reactive power value ($Q_1$) signal, or a combination of these high and low frequency portions. Equation 4 or 5 may be used to compute the second reactive power value ($Q_2$) using CFs and one or more portions of the first reactive power value ($Q_1$).

Further at step 912, a reactive power compensation command may be generated based on the computed the second reactive power value ($Q_2$). Finally at step 914, the reactive power compensation command may be transmitted to the power converter (such as 110) for compensating the self-induced voltage variation. In one embodiment, the reactive power output of the power converter may be damped when the voltage value 'V' is closer to the lower limit, whereas the reactive power output may be amplified or not damped when the voltage value 'V' is closer to the upper limit.

The above-mentioned operation of computation of the second reactive power value ($Q_2$), and generation and transmission of the reactive power compensation command may be repeated continuously during the operation of the electrical power system.

Various embodiments described above in conjunction with FIGS. 2 and 3 above may be equally applied to the method 900 for the compensation of self-induced voltage variation.

The systems and methods in accordance with embodiments of the invention may provide selective reactive power compensation such that system losses in an electrical power system are reduced. This is achieved by compensating only when required and by reducing the reactive power compensation using one or more CFs when a voltage value 'V' at a POI is within pre-defined voltage limits. The reactive power compensation depends on the voltage value 'V'. When, for example during peak load, there are low voltage conditions, the voltage rise caused by the power injection from a power source may be allowed by a controller. This voltage rise may be beneficial to improve the low voltage conditions. Moreover, the embodiments of the invention compensate primarily for self-induced voltage variations.

Various embodiments may take the form of an entirely hardware embodiment, an entirely software embodiment, or an embodiment containing both hardware and software components. In accordance with one embodiment, the invention may be implemented in software, which includes but is not limited to firmware, resident software, or microcode.

Furthermore, the invention may take the form of a computer program product, accessible from a non-transitory computer-usable or computer-readable medium, providing program code for use by, or in connection with, a computer or any instruction execution system. For the purposes of this description, a computer-usable or computer readable medium may be any apparatus that can contain, store, communicate, propagate, or transport the program for use by, or in connection with, the instruction execution system, apparatus, or device.

The medium can be an electronic, magnetic, optical, electromagnetic, infrared, or semiconductor system (or apparatus or device), or a propagation medium. Examples of a computer-readable medium include a semiconductor or solid-state memory, magnetic tape, a removable computer diskette, a random access memory (RAM), a read-only memory (ROM), a rigid magnetic disk, and an optical disk. Current examples of optical disks include compact disk-read only memory (CDROM), compact disk-read/write (CD-R/W), and Digital Versatile Disk (DVD).

A non-transitory computer-readable medium provided herein includes computer-readable instructions of a computer program, which when executed by a processor, causes the processor to perform a method. The non-transitory computer-readable medium further includes computer-readable instructions to perform the method for computing a first reactive power value ($Q_1$). The non-transitory computer-readable medium further includes computer-readable instructions to obtain a voltage value at a POI between at least one power source and a power grid. The non-transitory computer-readable medium further includes computer-readable instructions to compare the voltage value with at least one pre-defined voltage limit. The non-transitory computer-readable medium further includes computer-readable instructions to compute at least one CF corresponding to the at least one portion of the first reactive power value ($Q_1$) based on an output of the comparison between the voltage value and the at least one pre-defined voltage limit, and compute a second reactive power value ($Q_2$) as a function of one or more portions of the first reactive power value ($Q_1$) and the at least one CF. The non-transitory computer-readable medium further includes computer-readable instructions to generate a reactive power compensation command based on the computed second reactive power value ($Q_2$), and transmit the reactive power compensation command to a power converter.

The skilled artisan will recognize the interchangeability of various features from different embodiments. Similarly, the various method steps and features described, as well as other known equivalents for each such methods and features, can be mixed and matched by one of ordinary skill in this art to construct additional assemblies and techniques in accordance with principles of this invention. It is, therefore, to be understood that the appended claims are intended to cover all such modifications and changes as fall within the true spirit of the invention.

The invention claimed is:

1. A method, comprising:
    (i) computing a first reactive power value ($Q_1$);
    (ii) obtaining a voltage value at a point of interconnection (POI) between at least one power source and a power grid;
    (iii) comparing the voltage value with at least one pre-defined voltage limit, wherein the at least one pre-defined voltage limit comprises a plurality of pre-defined voltage limits; and
    for at least one portion of the first reactive power value ($Q_1$):
        (iv) computing at least one compensation factor (CF) corresponding to the at least one portion of the first reactive power value ($Q_1$) based on an output of the comparison between the voltage value and the at least one pre-defined voltage limit;
        (v) computing a second reactive power value ($Q_2$) as a function of the at least one portion of the first reactive power value ($Q_1$) and the at least one CF;
        (vi) generating a reactive power compensation command based on the computed second reactive power value ($Q_2$); and
        (vii) transmitting the reactive power compensation command to a power converter;
    wherein the plurality of pre-defined voltage limits includes a lower limit and an upper limit, wherein at least one CF computed when the voltage value is closer to the lower limit is less than or equal to at least one CF computed when the voltage value is closer to the upper limit.

2. A method, comprising:
    (i) computing a first reactive power value ($Q_1$);
    (ii) obtaining a voltage value at a point of interconnection (POI) between at least one power source and a power grid;
    (iii) comparing the voltage value with at least one pre-defined voltage limit, wherein the at least one pre-defined voltage limit comprises a plurality of pre-defined voltage limits; and
    for at least one portion of the first reactive power value ($Q_1$):
        (iv) computing at least one compensation factor (CF) corresponding to the at least one portion of the first reactive power value ($Q_1$) based on an output of the comparison between the voltage value and the at least one pre-defined voltage limit;
        (v) computing a second reactive power value ($Q_2$) as a function of the at least one portion of the first reactive power value ($Q_1$) and the at least one CF;
        (vi) generating a reactive power compensation command based on the computed second reactive power value ($Q_2$); and
        (vii) transmitting the reactive power compensation command to a power converter, wherein the plurality of pre-defined voltage limits includes a lower limit and an upper limit, wherein the at least one CF is a minimum CF value when the voltage value is less than or equal to the lower limit and the at least one CF is a maximum CF value when the voltage value is greater than or equal to the upper limit.

3. The method of claim 1, wherein computing the at least one CF comprises:
    computing a N number of CFs at corresponding time instances; and
    computing the at least one CF as a function of the N number of CFs.

4. The method of claim 1, wherein the at least one portion of the first reactive power value ($Q_1$) comprises at least one of a low frequency portion of the first reactive power value ($Q_1$) or a high frequency portion of the first reactive power value ($Q_1$).

5. The method of claim 4, wherein the at least one CF is a maximum CF value when the at least one portion of the first reactive power value ($Q_1$) comprises the high frequency portion of the first reactive power value ($Q_1$), and the at least one CF is a minimum CF value when the at least one portion of the first reactive power value ($Q_1$) comprises the low frequency portion of the first reactive power value ($Q_1$).

6. A system, comprising:
    a controller coupled to a power converter, the controller comprising:
        a first computation unit for computing a first reactive power value ($Q_1$),
        a voltage determination unit for obtaining a voltage value at a point of interconnection (POI) between at least one power source and a power grid,
        a voltage comparator unit for comparing the voltage value with at least one pre-defined voltage limit, and
        for at least one portion of the first reactive power value ($Q_1$):
            a compensation factor (CF) computation unit for computing at least one CF corresponding to the at least one portion of the first reactive power value ($Q_1$) based on an output of the comparison between the voltage value and the at least one pre-defined voltage limit,
            a second computation unit for computing a second reactive power value ($Q_2$) as a function of the at least one portion of the first reactive power value ($Q_1$) and the at least one CF,
            a command generation unit for generating a reactive power compensation command based on the computed second reactive power value ($Q_2$), and
            an input/output (I/O) unit for transmitting the reactive power compensation command to the power converter;
        wherein the at least one pre-defined voltage limit comprises a lower limit and an upper limit, wherein at least one CF computed when the voltage value is closer to the lower limit is less than or equal to at least one CF computed when the voltage value is closer to the upper limit.

7. The system of claim 6, wherein the at least one power source comprises a renewable energy source.

8. A system, comprising:
    a controller coupled to a power converter, the controller comprising:
        a first computation unit for computing a first reactive power value ($Q_1$),
        a voltage determination unit for obtaining a voltage value at a point of interconnection (POI) between at least one power source and a power grid, a voltage comparator unit for comparing the voltage value with at least one pre-defined voltage limit, and for at least one portion of the first reactive power value ($Q_1$):

a compensation factor (CF) computation unit for computing at least one CF corresponding to the at least one portion of the first reactive power value ($Q_1$) based on an output of the comparison between the voltage value and the at least one pre-defined voltage limit, a second computation unit for computing a second reactive power value ($Q_2$) as a function of the at least one portion of the first reactive power value ($Q_1$) and the at least one CF, a command generation unit for generating a reactive power compensation command based on the computed second reactive power value ($Q_2$), and an input/output (I/O) unit for transmitting the reactive power compensation command to the power converter, wherein the at least one pre-defined voltage limit comprises a lower limit and an upper limit, wherein the at least one CF is a minimum CF value when the voltage value is less than or equal to the lower limit and the at least one CF is a maximum CF value when the voltage value is greater than or equal to the upper limit.

9. The system of claim 6, wherein the CF computation unit is configured to compute the at least one CF by:

computing a N number of CFs at corresponding time instances; and computing the at least one CF as a function of the N number of CFs.

10. The system of claim 6, wherein the at least one portion of the first reactive power value ($Q_1$) comprises at least one of a low frequency portion of the first reactive power value ($Q_1$), or a high frequency portion of the first reactive power value ($Q_1$).

11. The system of claim 10, wherein the at least one CF is a maximum CF value when the at least one portion of the first reactive power value ($Q_1$) comprises the high frequency portion of the first reactive power value ($Q_1$), and the at least one CF is a minimum CF value when the at least one portion of the first reactive power value ($Q_1$) comprises the low frequency portion of the first reactive power value ($Q_1$).

12. A non-transitory computer-readable medium comprising computer-readable instructions of a computer program that, when executed by a processor, cause the processor to perform a method, the method comprising:

computing a first reactive power value ($Q_1$);

obtaining a voltage value at a point of interconnection (POI) between at least one power source and a power grid;

comparing the voltage value with at least one pre-defined voltage limit; and for at least one portion of the first reactive power value ($Q_1$):

computing at least one compensation factor (CF) corresponding to the at least one portion of the first reactive power value ($Q_1$) based on an output of the comparison between the voltage value and the at least one pre-defined voltage limit;

computing a second reactive power value ($Q_2$) as a function of the at least one portion of the first reactive power value ($Q_1$) and the at least one CF;

generating a reactive power compensation command based on the computed second reactive power value ($Q_2$); and transmitting the reactive power compensation command to a power converter; wherein the at least one pre-defined voltage limit comprises a lower limit and an upper limit, wherein at least one CF computed when the voltage value is closer to the lower limit is less than or equal to at least one CF computed when the voltage value is closer to the upper limit.

13. A non-transitory computer-readable medium comprising computer-readable instructions of a computer program that, when executed by a processor, cause the processor to perform a method, the method comprising:

computing a first reactive power value ($Q_1$);

obtaining a voltage value at a point of interconnection (POI) between at least one power source and a power grid;

comparing the voltage value with at least one pre-defined voltage limit and for at least one portion of the first reactive power value ($Q_1$):

computing at least one compensation factor (CF) corresponding to the at least one portion of the first reactive power value ($Q_1$) based on an output of the comparison between the voltage value and the at least one pre-defined voltage limit;

computing a second reactive power value ($Q_2$) as a function of the at least one portion of the first reactive power value ($Q_1$) and the at least one CF;

generating a reactive power compensation command based on the computed second reactive power value ($Q_2$); and transmitting the reactive power compensation command to a power converter, wherein the at least one pre-defined voltage limit comprises a lower limit and an upper limit, wherein the at least one CF is a minimum CF value when the voltage value is less than or equal to the lower limit and the at least one CF is a maximum CF value when the voltage value is greater than or equal to the upper limit.

14. The non-transitory computer-readable medium of claim 12, wherein computing the at least one CF comprises:

computing a N number of CFs at corresponding time instances; and computing the at least one CF as a function of the N number of CFs.

15. The non-transitory computer-readable medium of claim 12, wherein the at least one portion of the first reactive power value ($Q_1$) comprises at least one of a low frequency portion of the first reactive power value ($Q_1$) or a high frequency portion of the first reactive power value ($Q_1$).

16. The non-transitory computer-readable medium of claim 15, wherein the at least one CF is a maximum CF value when the at least one portion of the first reactive power value ($Q_1$) comprises the high frequency portion of the first reactive power value ($Q_1$), and the at least one CF is a minimum CF value when the at least one portion of the first reactive power value ($Q_1$) comprises the low frequency portion of the first reactive power value ($Q_1$).

* * * * *